(12) United States Patent
Anderson et al.

(10) Patent No.: US 7,538,006 B1
(45) Date of Patent: May 26, 2009

(54) ANNULAR DAMASCENE VERTICAL NATURAL CAPACITOR

(75) Inventors: Felix Patrick Anderson, Colchester, VT (US); Thomas Leddy McDevitt, Underhill, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/126,866

(22) Filed: May 24, 2008

(51) Int. Cl.
*H01L 21/00* (2006.01)
(52) U.S. Cl. .................. 438/393; 438/395; 438/396
(58) Field of Classification Search .................. 438/393, 438/395–396
See application file for complete search history.

(56) References Cited

U.S. PATENT DOCUMENTS

| | | | | |
|---|---|---|---|---|
| 2,969,488 A * | 1/1961 | Foster et al. | ............. | 361/308.3 |
| 2,975,345 A * | 3/1961 | Koller | ............. | 361/312 |
| 3,035,237 A * | 5/1962 | Schlicke | ............. | 333/182 |
| 3,906,297 A * | 9/1975 | Hunt | ............. | 361/309 |
| 4,177,495 A * | 12/1979 | Perret | ............. | 361/279 |
| 4,591,947 A * | 5/1986 | Bagley et al. | ............. | 361/310 |
| 6,218,230 B1 * | 4/2001 | Fujiwara et al. | ............. | 438/238 |
| 6,319,790 B1 * | 11/2001 | Kubota | ............. | 438/396 |
| 6,548,367 B1 | 4/2003 | Ng et al. | | |
| 6,765,779 B2 * | 7/2004 | Stevenson et al. | ............. | 361/302 |
| 6,765,780 B2 * | 7/2004 | Brendel et al. | ............. | 361/302 |
| 6,770,930 B2 * | 8/2004 | Oashi | ............. | 257/306 |
| 6,774,423 B2 * | 8/2004 | Kubo | ............. | 257/303 |
| 7,015,654 B1 * | 3/2006 | Kuhlmann et al. | ............. | 315/291 |
| 7,018,933 B2 * | 3/2006 | Kim et al. | ............. | 438/710 |
| 7,327,551 B2 * | 2/2008 | Chien et al. | ............. | 361/301.2 |
| 7,466,534 B2 * | 12/2008 | Chinthakindi | ............. | 361/306.2 |
| 2007/0123015 A1 * | 5/2007 | Chinthakindi et al. | ....... | 438/597 |
| 2007/0279835 A1 * | 12/2007 | Chinthakindi | ............. | 361/306.2 |
| 2008/0304203 A1 * | 12/2008 | Chinthakindi | ............. | 361/306.2 |
| 2008/0305606 A1 * | 12/2008 | Chinthakindi | ............. | 438/393 |

\* cited by examiner

*Primary Examiner*—Laura M Menz
(74) *Attorney, Agent, or Firm*—Nelson and Nelson; Daniel P. Nelson; Alexis V. Nelson

(57) ABSTRACT

A method for forming a vertical natural capacitor in an integrated circuit is disclosed. In one embodiment, the method includes forming a first set of concentric conductive annular structures in a first metal layer of an integrated circuit. The first set includes a first electrode and a second electrode. The method further includes forming a second set of concentric conductive annular structures in a second metal layer of the integrated circuit, the second set being substantially axially concentric with the first set. The second set also includes a first electrode and a second electrode. The method includes coupling, using conductive vias, the first electrode of the first set to the first electrode of the second set, and the second electrode of the first set to the second electrode of the second set.

1 Claim, 4 Drawing Sheets

ANNULAR DAMASCENE VERTICAL NATURAL CAPACITOR

BACKGROUND

1. Field of the Invention

This invention relates to capacitors, and more particularly to vertical natural capacitors for use in integrated circuits.

2. Background of the Invention

Vertical natural capacitors are on-chip capacitors that are incorporated into the interconnect levels of integrated circuits, typically during Back-End-Of-The-Line (BEOL) processes. Such capacitors may be placed in close proximity to various components on the integrated circuit in order to minimize inductive or resistive losses that may occur when using off-chip capacitors. Vertical natural capacitors may be formed using the same processes that are used to form wiring on integrated circuits, using the native insulator material as the dielectric. Thus, these capacitors may be fabricated without additional mask layers or new films, making these capacitors relatively simple and inexpensive.

Conventional vertical natural capacitors are typically formed as interleaved comb-like structures in the interconnect levels of the integrated circuit. FIG. 1 shows one example of a conventional vertical natural capacitor 100. In this example, a first comb-like structure 102a, forming a first electrode, interleaves with a second comb-like structure 102b, forming a second electrode. Circles 104 represent potential locations for vias connecting the comb-like structures 102a, 102b to similar or identical structures immediately above or below, thereby forming a stack. FIG. 2 shows a side profile of the vertical natural capacitor 100 showing the stack of comb-like structures 102b and vias 200 interconnecting the structures 102b.

One problem with the rectangular comb-like structures 102a, 102b illustrated in FIG. 1, or any rectangular or x-y dimensioned structure, are the corners, edges, or protrusions that may exist within such structures. For example, FIG. 1 shows several corners 106 that exist in the comb-like structures 102a, 102b. These corners 106 may create areas of high electric field density which may cause capacitor breakdown, shorting, or current leakage through the dielectric. As will be explained in more detail in association with FIG. 6A, the rectangular configuration may also create areas of high field density when vias protrude from the sides of wires in such structures.

In view of the foregoing, what is needed is a vertical natural capacitor structure that is able to reduce areas of high field density, thereby reducing capacitor breakdown, shorting, or leakage through the dielectric. Ideally, such a capacitor would be easily incorporated into the interconnect levels of an integrated circuit. Further needed is a capacitor that is able to reduce areas of high field density caused by vias protruding from the sides of wires.

SUMMARY

The invention has been developed in response to the present state of the art and, in particular, in response to the problems and needs in the art that have not yet been fully solved by currently available vertical natural capacitors. Accordingly, the invention has been developed to provide improved vertical natural capacitors that overcome various limitations of the prior art. The features and advantages of the invention will become more fully apparent from the following description and appended claims, or may be learned by practice of the invention as set forth hereinafter.

Consistent with the foregoing, a method for forming a vertical natural capacitor in an integrated circuit is disclosed herein. In one embodiment, the method includes forming a first set of concentric conductive annular structures in a first metal layer of an integrated circuit. The first set includes a first electrode and a second electrode. The method further includes forming a second set of concentric conductive annular structures in a second metal layer of the integrated circuit, the second set being substantially axially concentric with the first set. The second set also includes a first electrode and a second electrode. The method includes coupling, using conductive vias, the first electrode of the first set to the first electrode of the second set, and the second electrode of the first set to the second electrode of the second set.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
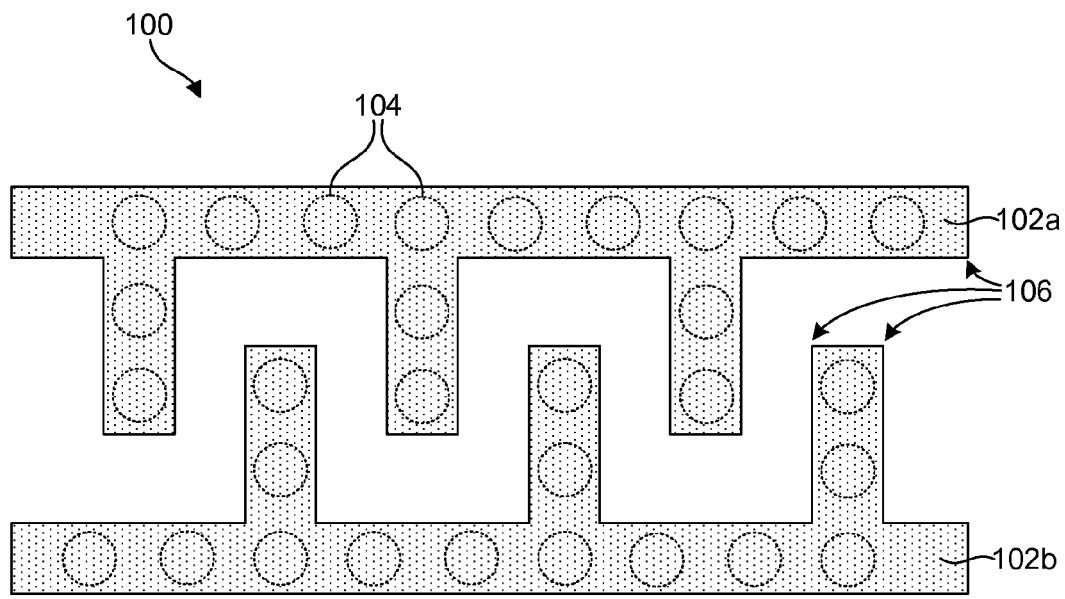
FIG. 1 is a top view of one example of a conventional vertical natural capacitor having interleaving rectangular comb-like structures.
Figure 2:
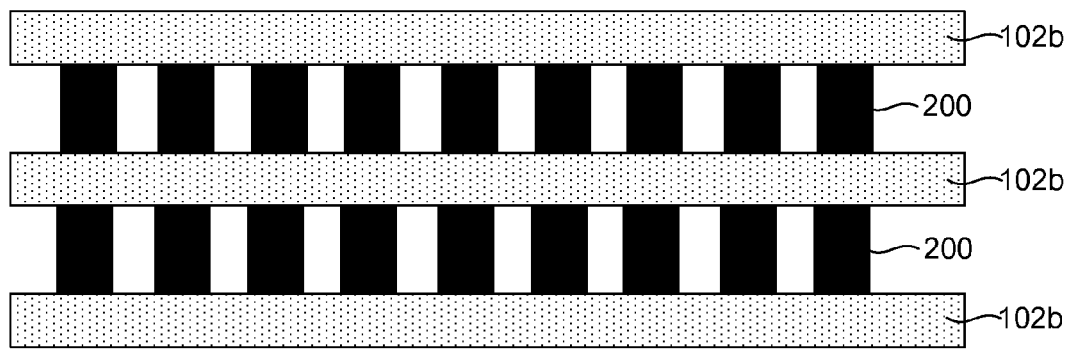
FIG. 2 is a side profile view of the vertical natural capacitor of FIG. 1.
Figure 3:
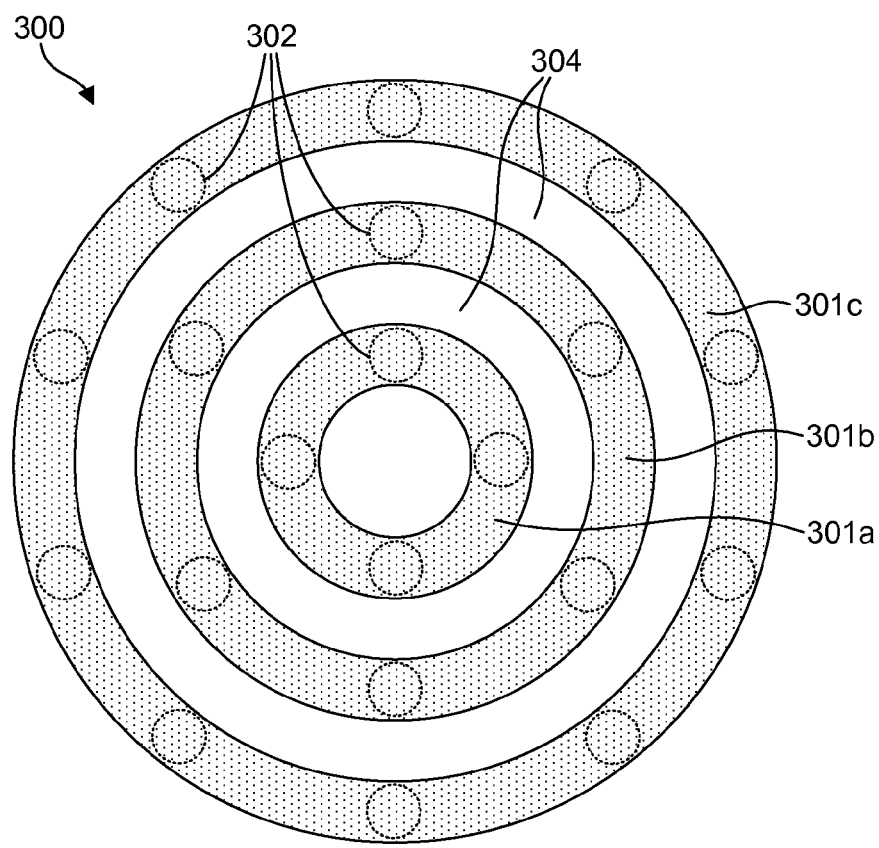
FIG. 3 is a top view of one embodiment of an improved vertical natural capacitor using concentric conductive annular structures, in this example concentric circular structures.

Referring to FIG. 3, in selected embodiments, a vertical natural capacitor in accordance with the invention may eliminate many or all corners, protrusions, or edges which may create areas of high field density within the capacitor. This will ideally reduce capacitor breakdown, shorting, and/or leakage through the dielectric. In selected embodiments, a vertical natural capacitor in accordance with the invention may include multiple concentric conductive annular structures 300 arranged into a stack-like structure within the metal layers (i.e., interconnect layers) of an integrated circuit. These annular structures may be coupled together with conductive vias 302 to form the capacitor. For the purposes of this description, the term "annular" is used to describe any ring-like structure, including, for example, circular, oval-shaped, spiral, or other rounded structures. In certain embodiments, the ring-like structure may be closed (e.g., continuous) or open (e.g., broken or discontinuous).

For example, in one embodiment, the annular structures 300 may include circular conductive rings 301*a-c* arranged in the interconnect layers of an integrated circuit. The rings 301*a-c* may be formed in the same manner as other metal wires in the interconnect layers. In this example, an inner and outer ring 301*a*, 301*c* form part of a first electrode of the capacitor, and a center ring 301*b* forms part of a second electrode of the capacitor.

An insulator material 304 that is native to the interconnect levels of the integrated circuit may provide the dielectric material between the rings 301*a-c*. In certain embodiments, the inner and outer rings 301*a*, 301*c* may be electrically connected together in an interconnect layer (not shown) either above or below the layer 300. In other embodiments, one or more rings, such as the center ring 301*b* may be broken to provide a path to electrically connect the inner and outer rings 301*a*, 301*c*. Although the illustrated annular structure 300 includes three rings 301*a-c*, fewer or additional rings may be used in the capacitor. For example, a fourth ring (not shown) may encircle the outer ring 301*c* and be electrically connected to the center ring 301*b*, thereby forming part of the second electrode.

Figure 4:
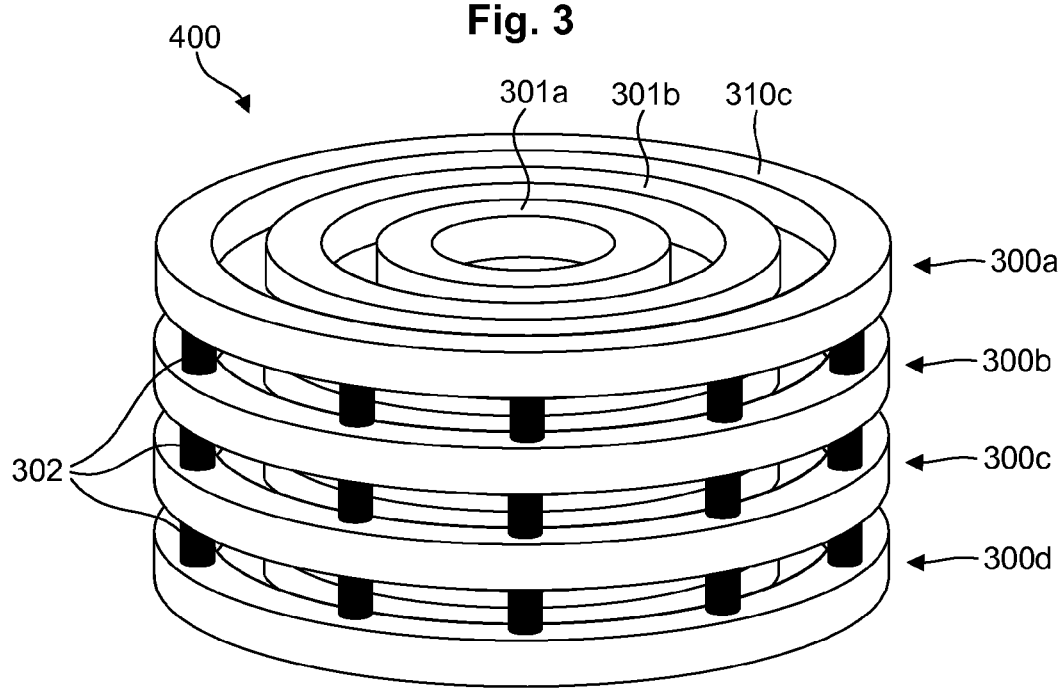
FIG. 4 is a perspective view of the vertical natural capacitor of FIG. 3.

Referring to FIG. 4, a perspective view of one embodiment of a vertical natural capacitor 400 using circular conductive rings 301*a-c* is illustrated. Here, multiple layers 300*a-d* of concentric rings 301*a-c* are stacked in the interconnect layers of an integrated circuit to form the capacitor 400. Vias 302 may connect corresponding rings 301*a-c* in each layer 300*a-d*. Although the vertical natural capacitor 400 is shown here to include four layers 300*a-d*, the vertical natural capacitor 400 is not limited to any number of layers 300*a-d*.

Figure 5:
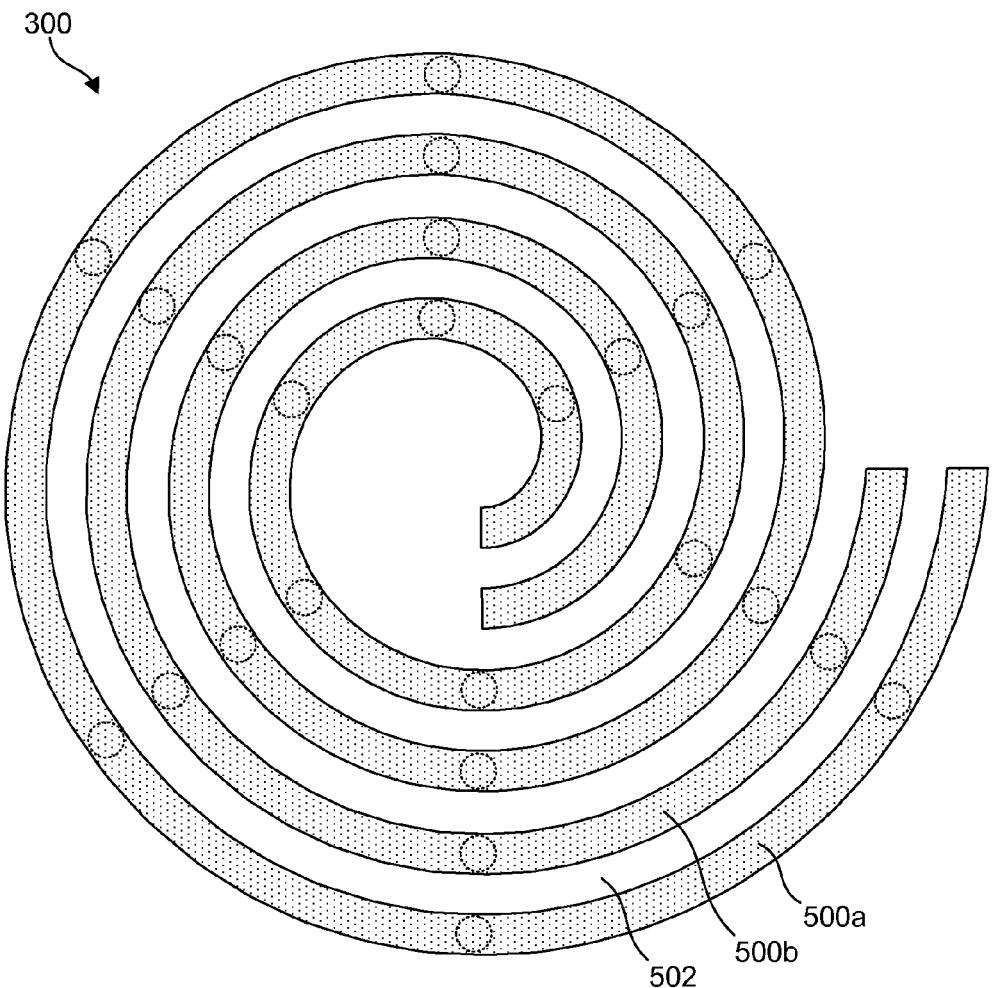
FIG. 5 is a top view of one embodiment of an improved vertical natural capacitor using concentric conductive annular structures, in this example interleaving spiral-shaped structures.

Referring to FIG. 5, in another embodiment, the concentric annular structures 300 may include wires 500*a*, 500*b* formed in a spiral shape. Here, the concentric annular structures 300 include two adjacent wires 500*a*, 500*b* coiled together in a spiral shape. A first wire 500*a* may form part of a first electrode of the capacitor and a second wire 500*b* may form part of a second electrode of the capacitor. A native insulator material 502 may provide a dielectric layer between the wires 500*a*, 500*b*. Like the previous example, the spiral structures 500*a*, 500*b* may be stacked and interconnected with vias to form a vertical natural capacitor in accordance with the invention.

Figure 6A:
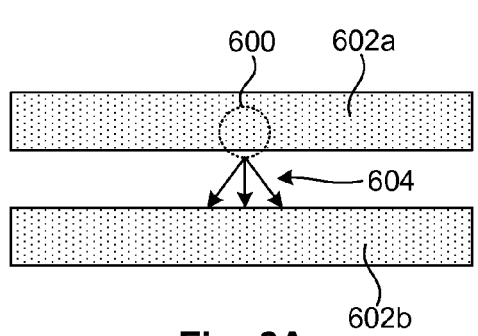
FIG. 6A is a diagram showing the electric field density created by a via protruding from a straight wire.
Figure 6B:
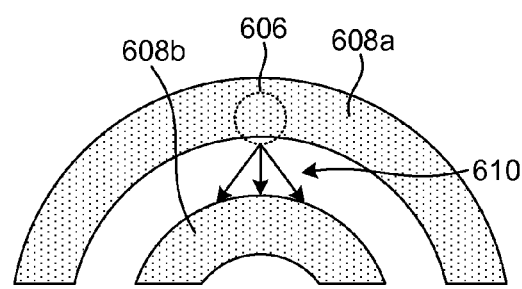
FIG. 6B is a diagram showing the electric field density created by a via protruding from a rounded wire.

Referring to FIGS. 6A and 6B, as previously mentioned, conventional rectangular vertical natural capacitors may generate areas of high field density when vias, which are typically round, protrude from the sides of wires, which are typically straight. Misalignments between the wires and vias may create such protrusions. FIG. 6A shows one example of a via 600 protruding from the side of a straight wire 602*a*, which is adjacent to another straight wire 602*b*. FIG. 6B shows an example of a via 606 protruding from the side of a rounded wire 608*a*, which is adjacent to another rounded wire 608*b*. Because the strength of the electric field between the vias 600, 606 and the adjacent wires 602*b*, 608*b* is directly related to the distance therebetween, the geometry of the wires may play an important role in minimizing or reducing the strength of the electric field.

For example, referring to FIG. 6A, when a via 600 protrudes from the side of a straight wire 602*a*, the distance between the via 600 and the adjacent wire 602*b* may be represented by vectors 604. Similarly, when a via 606 protrudes from the side of a rounded wire 608*a*, the distance between the via 606 and the adjacent rounded wire 608*b* may be represented by vectors 610. As shown in the drawings, the average distance is greater for the rounded wires 608*a*, 608*b* and thus will minimize or reduce the strength of the electric field. This is true where the via 606 protrudes from the inside diameter of the wire 608*a*. The opposite is true, however, where the via 606 protrudes from the outside diameter of the wire 608*a*. Thus, in selected embodiments in accordance with the invention, vias 606 may be designed to be slightly off-center with respect to the wire 608*a*, tending toward the inside diameter or the inside of the arc of curvature of the wire 608*a*.

The annular capacitor described herein may be formed in any suitable manner known to those of skill in the art of semiconductor manufacturing processes. For example, in selected embodiments, the capacitor may be formed in the interconnect levels of an integrated circuit using a damascene process. In such a process, a dielectric material such as an oxide material is initially provided on a semiconductor substrate. Patterns may then be etched into the dielectric material. These patterns may be filled with a conductive material such as copper to create the annular conductive patterns described herein. This process may be repeated to create the several layers of the capacitor.

In selected embodiments, patterns that are used to create vias and wires may be created in a multi-step process. For example, in certain embodiments, a first process may include applying a photoresist layer and etching the via patterns into the dielectric material. The photoresist layer may then be removed. A second process may include applying a new photoresist layer and etching the metal-wiring pattern into the dielectric material. This photoresist layer may also be removed. The resulting via and metal-wiring patterns may then be metalized simultaneously (i.e., filled with a metal) to create the conductive structures described herein.

Figure 7:
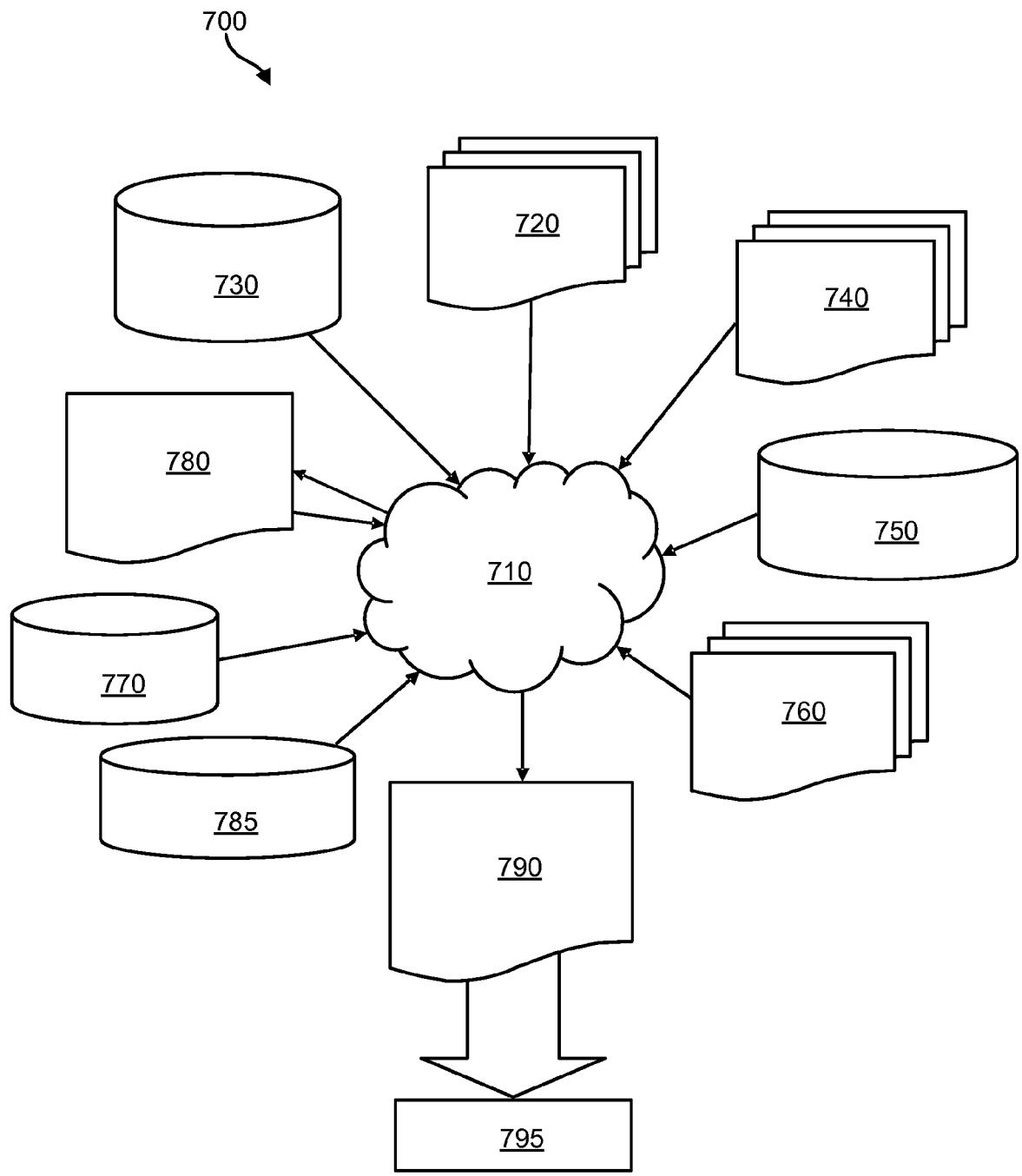
FIG. 7 is a flow diagram of a design process used in semiconductor design, manufacture, and/or test.

FIG. 7 shows a block diagram of an exemplary design flow 700 used, for example, in semiconductor design, manufacturing, and/or test. Design flow 700 may vary depending on the type of IC being designed. For example, a design flow 700 for building an application specific IC (ASIC) may differ from a design flow 700 for designing a standard component. Design structure 720 is preferably an input to a design process 710 and may come from an IP provider, a core developer, or other design company or may be generated by the operator of the design flow, or from other sources. Design structure 720 may include an embodiment of the invention as shown in FIGS. 3 through 5 in the form of schematics or HDL, a hardware-description language (e.g., Verilog, VHDL, C, etc.). Design structure 720 may be contained or stored on one or more machine-readable medium.

For example, design structure 720 may be a text file or a graphical representation of an embodiment of the invention as shown in FIGS. 3 through 5. Design process 710 preferably synthesizes (or translates) an embodiment of the invention as shown in FIGS. 3 through 5 into a netlist 780, where netlist 780 is, for example, a list of wires, transistors, logic gates, control circuits, I/O, models, or the like that describes the connections to other elements and circuits in an IC design and is recorded on at least one machine-readable medium. For example, the medium may be a CD, a compact flash, other flash memory, a packet of data to be sent via the Internet, or other networking suitable means. The synthesis may be an iterative process in which netlist 780 is resynthesized one or more times depending on design specifications and parameters for the circuit.

Design process 710 may include using a variety of inputs; for example, inputs from library elements 730 which may house a set of commonly used elements, circuits, and devices, including models, layouts, and symbolic representations for a given manufacturing technology (e.g., different technology nodes, 32 nm, 45 nm, 90 nm, etc.), design specifications 740, characterization data 750, verification data 760, design rules 770, and test data files 785 (which may include test patterns and other testing information). Design process 710 may further include, for example, standard circuit design processes such as timing analysis, verification, design rule checking, place and route operations, or the like. One of ordinary skill in the art of IC design can appreciate the extent of possible electronic design automation tools and applications used in design process 710 without deviating from the scope and spirit of the invention. The design structure of the invention is not limited to any specific design flow.

Design process 710 may translate an embodiment of the invention as shown in FIGS. 3 through 5, along with any additional IC design or data (if applicable), into a second design structure 790. Design structure 790 may reside on a storage medium in a data format used for the exchange of layout data of ICs and/or symbolic data format (e.g. information stored in a GDSII (GDS2), GLI, OASIS, map files, or any other suitable format for storing such design structures). Design structure 790 may include information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3 through 5. Design structure 790 may then proceed to a stage 795 where, for example, design structure 790 proceeds to tape-out, is released to manufacturing, is released to a mask house, is sent to another design house, is sent back to the customer, or the like.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for forming a capacitor in an integrated circuit, the method comprising:

forming a first set of concentric conductive annular structures in a first metal layer of an integrated circuit, the first set comprising a first electrode and a second electrode;

forming a second set of concentric conductive annular structures in a second metal layer of the integrated circuit, the second set being concentric with the first set, the second set comprising a first electrode and a second electrode; and coupling, using conductive vias, the first electrode of the first set to the first electrode of the second set, and the second electrode of the first set to the second electrode of the second set.

\* \* \* \* \*